July 31, 1962 G. F. FISHER 3,047,749

MINIATURIZED PIEZOELECTRIC CRYSTAL APPARATUS AND METHOD OF MAKING SAME

Filed Aug. 5, 1959

INVENTOR.
George F. Fisher

BY

Hovey, Schmidt, Johnson & Hovey
ATTORNEYS.

United States Patent Office 3,047,749

Patented July 31, 1962

3,047,749

MINIATURIZED PIEZOELECTRIC CRYSTAL APPARATUS AND METHOD OF MAKING SAME

George F. Fisher, Parkville, Mo., assignor to Midland Manufacturing Co., Inc., Kansas City, Kans., a corporation of Kansas Filed Aug. 5, 1959, Ser. No. 831,877
8 Claims. (Cl. 310—9.4)

This invention relates generally to the field of piezoelectric crystal units and more particularly to such a unit constructed in novel fashion to provide optimum miniaturization without sacrificing performance.

The present invention is related to an industry-wide program in which specialists in various fields have attempted to develop new and improved components in their particular fields which would be adapted for use in cooperation with each other to present modular circuit structures of hitherto unknown minaturization of volume, minimization of weight and optimization of ruggedness, reliability and performance. Although not limited to such use, the structure of this invention is particularly adapted for employment in conjunction with other types of such miniaturized, modular components.

The task of developing an optimumly miniaturized piezoelectric apparatus presented many problems not encountered in connection with the miniaturization of certain other types of components. For example, the dimensioning of the piezoelectric element itself is a critical factor in determining its frequency of operation; the piezoelectric element must be so mounted as not to be unduly damped or otherwise restricted against freedom to vibrate at the desired frequency of operation; piezoelectric elements of the dimensions involved are extremely fragile and suffer impairment or loss of operability upon physical damage thereto; piezoelectric crystal assemblies are desirably sealed hermetically; and attention must be given in piezoelectric assemblies to the relationship between conductive and insulating parts and the provision of electrode structures for the piezoelectric element and lead connections to the latter. The magnitude of each of such problems is seriously compounded by the degree of miniaturization required and were found to be considerable when attempt was made to provide an efficiently operating type of piezoelectric crystal apparatus capable of resonance at frequencies of from the order of 120 megacycles on down to about 7 megacycles or lower and which apparatus would occupy a space of maximum dimensions of .05 in. x .3 in. x .3 in., this is a volume of .0045 cubic in.

Accordingly, it is the primary object of this invention to provide miniaturized piezoelectric crystal apparatus and a method of making the same which will overcome all of the above mentioned problems and fulfill all of the above mentioned requirements.

It is another important object of the invention to provide such optimumly miniaturized piezoelectric crystal apparatus which will be characterized by a high degree of performance efficiency and reliability.

It is another important object of the invention to provide such miniaturized piezoelectric crystal apparatus which is extremely rugged from the physical point of view permitting use of such apparatus under trying conditions of vibration, shock and the like, as may be encountered in missiles, military equipment, etc.

It is another important object of the invention to provide such miniaturized piezoelectric crystal apparatus which is adapted for convenient mounting and cooperative use in conjunction with other miniaturized components of similar size and external physical configuration.

Other important objects of the invention, including certain significant details of construction of the apparatus and critical steps in the production and assembly of the latter will be made clear or become apparent as the following description of the invention progresses.

Figures 1, 2, 3, 4, 5:
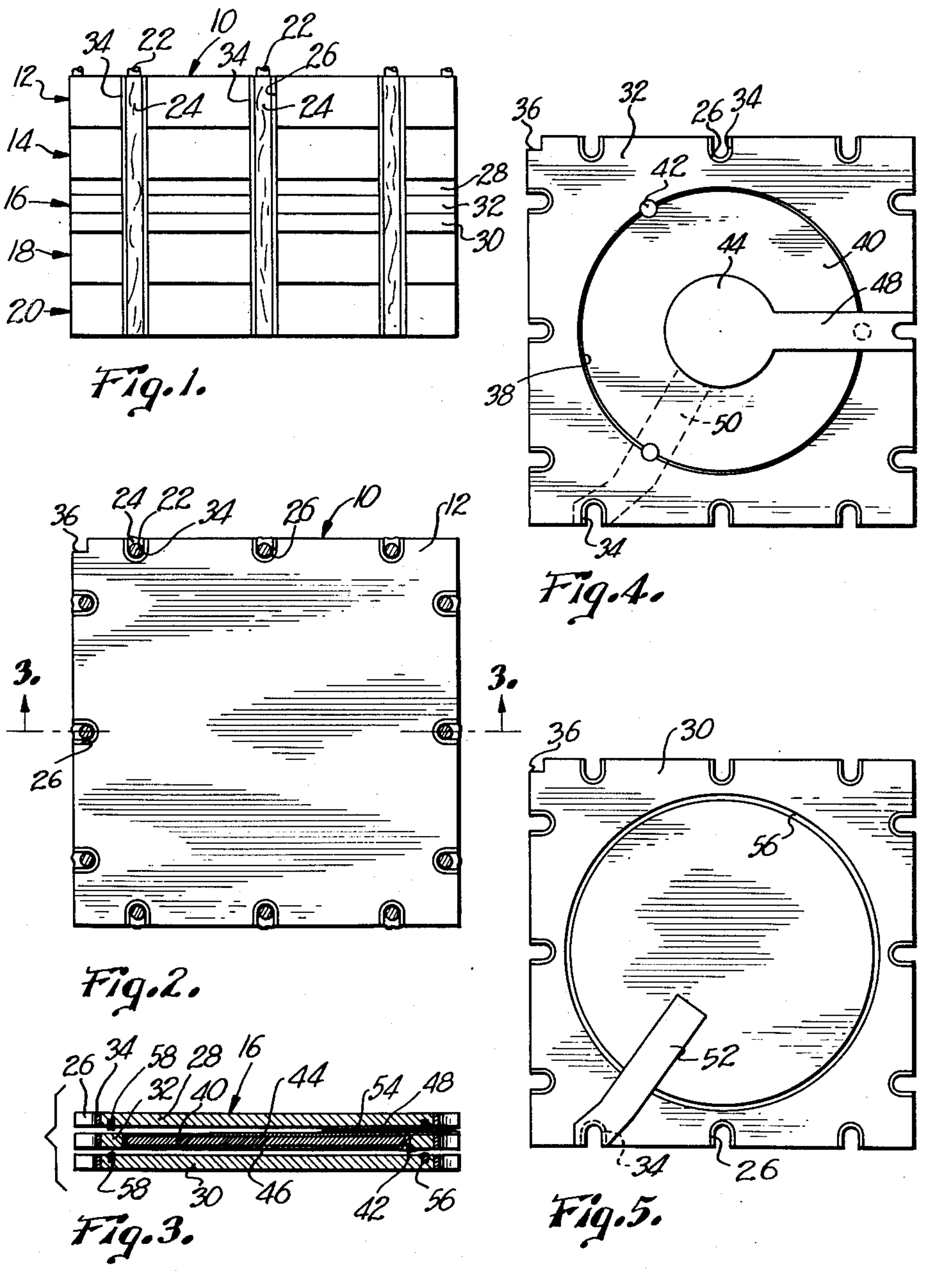
FIGURE 1 is a side elevational view of a miniaturized electric module in which one of the improved piezoelectric crystal assemblies contemplated by this invention is incorporated.
FIG. 2 is a top plan view of the module shown in FIG. 1.

FIG. 3 is an exploded, central cross-sectional view of the parts of the improved piezoelectric crystal assembly itself, the line of the section being indicated in FIG. 2 by the line designated 3—3, although it will be understood that the parts of the crystal assembly shown in FIG. 3 are not in their final assembled condition and that the dimensions of various parts have been greatly exaggerated to permit satisfactory illustration thereof;

FIG. 4 is a top plan view of the central wafer portion of the improved piezoelectric crystal assembly; and FIG. 5 is a top plan view of the lowermost wafer portion of the improved piezoelectric crystal apparatus.

It is to be understood that in illustrating and describing an exemplary, preferred embodiment of the invention reference will be made to certain specific dimensions and materials utilized in the preferred construction, but that those skilled in the art may manifestly use differing dimensions or equivalent materials to meet the requirements of particular applications.

It will also be apparent that certain other details of construction employed in the preferred embodiment disclosed for illustrative purposes will be subject to variation by those skilled in the art without departing from the principles of the invention.

Referring first to FIG. 1 of the drawing, an overall electrical circuitry module is generally designated by the numeral 10 and will be seen to include a number of component module assemblies generally designated 12, 14, 16, 18 and 20 arranged in stacked relationship and physically held together by a plurality of conductive rods or wires as at 22 soldered as at 24 into aligned notches 26 in the edges of the stacked component module assemblies 12, 14, 16, 18 and 20. The module assembly 16 represents the improved piezoelectric crystal apparatus of this invention and will be seen to include a pair of outer wafer portions 28 and 30 between which is sandwiched a central wafer portion 32, such wafer portions 28, 32 and 30 being superimposed upon each other in the order named.

Referring next to FIG. 2, the relationship of the notches 26 provided in each edge of each of the assemblies 12, 14, 16, 18 and 20 to the general configuration of the latter can better be seen. Each of the notches 26 is "pre-tinned" by deposition therein of a thin coating or layer 34 of conductive material, the rods or wires 22 being received within the tinned layer 34 and secured to the latter by the soldering 24. As illustrated, each of the assemblies 12 et seq. is provided with three such notches 26 spaced along each edge thereof for receiving corresponding wires 22 in physically interconnected and electrically contacting relationship with the tinned layer 34. The particular arrangement and number of the notches 26 is not critical and forms no part of the present invention, it being apparent that a differing number of notches 26 or a different arrangement of the same could be utilized. By the same token, although the square configuration of the principal dimensions of the assemblies 12 et seq. is preferred, it will be apparent that other shapes could probably be used. Where the square configuration is used, however, it has been found convenient to provide a reference notch 36 at one corner of each of the assemblies 12 et seq. to facilitate proper stacking and alignment thereof.

Referring now more particularly to FIGS. 3, 4 and 5, wherein the various portions of the improved piezoelectric crystal assembly 16 contemplated by this invention are illustrated in greater detail, it will be seen that each of the wafer portions 28, 32 and 30 includes a relatively thin, preferably square plate-like wafer of electrically insulating material provided with notches 26 and conductive notch coatings 34 as above described. The currently preferred material for formation of the wafers 28, 32 and 30 is alumina sub-strate ceramic material.

The central wafer 32 is provided with a centrally located circular opening or hole 38. In the preferred construction, the principal dimensions of the wafer 32 are .3 in. x .3 in. with a preferred thickness of .01 in. and a maximum thickness of .03 in., the diameter of the hole 38 being preferably .2 in. The primary dimensions of the wafers 28 and 30 are the same as for the wafer 32, and the thickness thereof is .01 in. giving an overall thickness for the assembly 16 ranging from the preferred size of .03 in. to a maximum of about .05 in.

A circular piezoelectric crystal element 40 of diameter about .005 in. less than the diameter of the hole 38 and of thickness controlled by the frequency of operation desired but always less than the thickness of the wafer 32 is centrally disposed within the hole 38 of wafer 32 and is suspended at a plurality of points along its circumferential edge by small spots as at 42 of fired silver or the like mounting the crystal element 40 upon the wafer 32 entirely within the hole 38 of the latter, that is, with both of the major surfaces of the central element 40 spaced at least slightly inwardly from the plane of the corresponding faces of the wafer 32. Although other types or cuts of piezoelectric crystals could conceivably be used for the element 40, the preferred construction utilizes an AT-cut quartz crystal which, in the dimensions mentioned, may be designed to operate satisfactorily over the entire frequency range mentioned above by the use of fundamental mode operation at the lower frequencies and harmonic mode operation at the higher frequencies. The mounting of such an element 40 as by the spots 42 has been found to involve a minimum interference with or damping of the vibrations of the element 40, so that the same still retains the desirable property of extremely high "Q."

The major, opposed faces of the crystal element 40 are each provided with a deposited electrode coating 44 (and 46) thereon. The electrode coating 44 extends from a generally circular portion thereof centrally of the element 40 thence radially of the element 40 in a strip 48 that extends across the gap between element 40 and the wafer 32 and toward the outer margin of the latter to a zone of physical and electrical contact with the tinned coating 34 in one of the notches 26. Similarly, the electrode structure 46 on the opposite face of the element 40 includes a strip portion 50 extending radially of the element 40 and outwardly across the corresponding face of wafer 32 to a zone of physical and electrical contact with the tinned coating 34 in a different one of the notches 26 from that to which strip 48 of electrode 44 extended.

Although the electrode extension strips 48 and 50 will, of themselves, normally permit electrical connections from the corresponding notches 26 to the electrode structures 44 and 46, it has been found desirable in the preferred construction to provide optimum reliability in this respect by depositing an elongated layer of conductive material on the face of each of the outer wafers 28 and 30 which is disposed to engage and make electrical contact with the corresponding of strips 48 and 50 when the three wafers 28, 32 and 30 are in their superimposed, assembled condition. Referring to FIG. 5, wherein the face of wafer 30 which is proximate to the wafer 32 is illustrated, such a contacting strip is illustrated at 52 extending from a central zone of the wafer 30 out to a zone of physical and electrical connection with the notch coating 34 of the notch 26 of wafer 30 that will be aligned with the notch 26 of wafer 32 to which strip 50 extends. A similar contacting strip 54 on the wafer 28 is illustrated in FIG. 3 in greatly exaggerated dimension, it being understood that the deposited electrode structures 44 and 46 and the strips 48, 50, 52 and 54 will each preferably be less than .001 in. thick.

In order to permit hermetic sealing of the element 40 within the assembly 16, each of the outer wafers 28 and 30 is provided with an annular groove 56 of diameter greater than the opening 38 in wafer 32. A cementitious sealing material is emplaced in each of the grooves 56 and extends very slightly therefrom, as illustrated at 58 in FIG. 3, so that when the wafers 28, 32 and 30 are assembled and placed together in superimposed relationship, the sealing material as at 58 will form a sealed physical interconnection between the central wafer 32 and each of the outer wafers 28 and 30, which sealing interconnection circumscribes the opening 38 and the crystal element 40. When so assembled the unit 16 presents a hermetically sealed piezoelectric crystal assembly of minimum volume and miniaturization hitherto not regarded as possible.

It will be understood that ultimate electrical connections of circuitry external to the unit 16 may be effected through the soldering of the conductive rods or wires 22 with the tinned layers 34 of the notches 26 to which the strips 48 and 50 (and 54 and 52 respectively) extend. The soldering of rods or wires 22 into the other notches 26 of the unit 16 serves to furnish further physical support and strength to the unit 16, although the same are not used for electrical connection with the electrodes 44 and 46 of the element 40.

It will be understood that the other units 12, 14, 18 and 20 of the overall module 10 could conceivably be piezoelectric crystal assemblies identical to the assembly 16 just described, in order to provide a plurality of piezoelectric crystals of different frequencies in a small, integrated unit, or such other assemblies 12 et seq. could be miniaturized components of different nature such as capacitors, resistors or the like which may be integrated into an operable electrical circuit by appropriate connections to the various conductive rods or wires 22 effected either within the assemblies 12 et seq. of the module 10 or externally of the latter.

With parts of the final desired assembly being of the diminutive size and individual fragility that they are, the method of producing and assembling the various parts of the assembly becomes important in itself.

The first step will normally be the formation of the wafers 28, 30 and 32. As above noted, such wafers may be of any electrically insulating material having the required strength when existent in the dimensions involved. Thus, glass, certain plastics or the like could conceivably be used. However, the currently preferred material is alumina sub-strate ceramic. Depending upon the material chosen, the wafers 28, 30 and 32 may be either cut from flat sheets thereof of the required thickness or may be molded to the desired configuration. The notches 26 in the wafers 28, 30 and 32 may be formed therein during the molding operation or, if the material is one which is cut rather than molded, may be ground into the edges of the wafer at the desired locations.

The next step may be the deposition of the conductive layer 34 within each of the notches 26. Such deposition or tinning may be carried out with any suitable conductive material, such as silver, by any of the conventional plating, evaporative, sputtering, firing or chemical processes known to the art.

Although it is conceivable that with certain moldable materials, the opening 38 could be molded into the wafer 32 during its initial formation, it has been found that greater accuracy in preserving the desired close tolerances is obtained by cutting the opening 38 after initial formation of the wafer 32, one conventional method being to use a diamond or other abrasive cutting tool.

The crystal element 40, which is preferably of AT-cut quartz, is cut and ground from the mother crystal in conventional fashion to a diameter dimension just slightly less than the diameter of the opening 38 and to a thickness dimension dependent upon the frequency of operation desired. The element 40 is emplaced within the opening 38 and therein supported with the faces of the element 40 spaced slightly inwardly from the planes of the major faces of the wafer 32 and, while so positioned, the spots 42 of cementitious material are applied and set. Although such spots 42 need not be of conductive material, it has been found that ordinary silver spotting compound used in the piezoelectric crystal manufacturing arts is quite satisfactory where the wafer 32 is formed of ceramic, such spotting compound being fired to set the same to effect the desired interconnection between adjacent zones on the edge of the crystal element 40 and the edge of the hole 38 in the wafer 32. It may be noted that only a small amount of spotting compound is used for each spot 42 to minimize the size and damping effect of the latter, as well as to prevent any substantial overhang of the spots 42 outwardly of the planes of the major faces of the wafer 32. It is significant that, once the element 40 has been secured within the opening 38 in the wafer 32 by the emplacement and setting of the interconnecting spots 42, the wafer 32 and element 40 may be handled as a unit, which adds considerable convenience in production in view of the diminutive size of the element 40 as well as protecting the latter against damage during handling. An incident advantage of such construction is that smaller crystal elements 40 and less quartz are required, because the wafer 32 surrounding the edge of the element 40 takes the place of that extra marginal portion of quartz normally provided on circular piezoelectric crystals for purposes of mounting and making lead connections but which do not contribute beneficially to the resonant vibratory action of the crystal.

The next step will be the deposition of the electrode structures 44 and 46 and their associated lead strips 48 and 50 upon the crystal element 40 and the wafer 32. Such deposition may be done chemically, by sputtering or by evaporation, each in the conventional way, with the evaporation technique being currently preferred. Such electrode and connection lead layers 44, 46, 48 and 50 may be of any suitable electrically conductive material such as silver, gold, aluminum, etc., with aluminum being currently preferred. As above noted, such conductive coatings are maintained to at least the usual thickness and are preferably of thickness considerably less than .001 in.

The strips 52 and 54 on the outer wafers 30 and 28 respectively, may be formed in the same way and of the same material described for the electrode and strip structures 44, 46, 48 and 50.

The next step is to apply a quantity of cementitious sealing material 58 within the notches 56 of the outer wafers 28 and 30. Such material may be either electrically conductive or nonconductive and various substances will be operable. However, the currently preferred sealing material is what is known in the trade as Hanovia fired silver paste. It will be noted that a sufficient amount of the material 58 is applied for the same to fill and slightly overflow the grooves 56 for contact with the adjacent faces of the wafer 32 when the wafers 28, 32 and 30 are assembled in superimposed engagement with each other. After such assembly, the superimposed wafers 28, 32 and 30 may be fired to set the silver paste or other sealing material, which then provides both a strong physical interconnection between the central wafer 32 and each of the outer wafers 28 and 30 and provides a hermetic seal for the crystal element 40 within opening 38 of wafer 32 between wafers 28 and 30.

Finally, electrical connection to the electrode structures 44 and 46 may be made by soldering a conductor, such as one of the rods or wires 22, into the notches 26 to which strips 48—54 and 50—52 respectively extend. Where such conductors 22 are laid along the aligned notches 26, as in the preferred construction, the same provide an additional physical stability to the assembly 16, as well as those which traverse the appropriate notches 26 providing electrical connections to the electrode structures 44 and 46.

From the illustrative description and drawings of the preferred embodiment chosen as exemplary of the application of the principles of both the method and apparatus aspects of the invention, it will be clear to those skilled in the art that certain minor modifications and variations may be employed without departing from the essence and true spirit of the invention. Accordingly, it is to be understood that the invention should be deemed limited only by the fair scope of the claims that follow and equivalents thereof.

Having thus described the invention, that is claimed as new and desired to be secured by Letters Patent is:

1. Miniaturized piezoelectrical crystal apparatus comprising: three relatively thin, electrically nonconductive wafers including a central wafer and a pair of outer wafers, said wafers being provided with a plurality of aligned notches in the outer edges thereof, said central wafer being provided with a circular opening therethrough disposed generally centrally thereof; a relatively thin, circular, quartz, piezoelectric element of lesser thickness than said central wafer and of lesser diameter than said opening disposed entirely within the latter; means for supporting said element for piezoelectric vibration within said opening; electrically conductive, electrode structure for each major face respectively of said element; means for holding said wafers in superimposed relationship with said central wafer between and spaced from said outer wafers; and electrically conductive means for each of said structures respectively disposed between said central wafer and a corresponding one of said outer wafers and extending from a zone of electrical contact with the corresponding structure outwardly to an edge of a wafer.

2. In apparatus as set forth in claim 1, wherein said holding means includes a sealing interconnection between said central wafer and each of said outer wafers respectively, said interconnections circumscribing the circumference of said opening.

3. In apparatus as set forth in claim 1, wherein said holding means includes a relatively stiff, elongated member traversing each set of said aligned notches and secured to said wafers within said notches.

4. In apparatus as set forth in claim 3, wherein said members are electrically conductive, and certain of same are in electrically coupled relationship with said electrically conductive means.

5. Miniaturized piezoelectric crystal apparatus comprising: three relatively thin, electrically nonconductive wafers including a central wafer and a pair of outer wafers, said central wafer being provided with a circular opening therethrough disposed generally centrally thereof; a relatively thin, circular, quartz, piezoelectric element of lesser thickness than said central wafer and of lesser diameter than said opening disposed entirely within the latter; means for supporting said element for piezoelectric vibration within said opening; electrically conductive, electrode structure for each major face respectively of said element; means for holding said wafers in superimposed relationship with said central wafer between said outer wafers and said element spaced from said outer wafers; and electrically conductive means for each of said structures respectively disposed between said central wafer and a corresponding one of said outer wafers and extending from a zone of electrical contact with the corresponding structure outwardly to an edge of a wafer.

6. In apparatus as set forth in claim 5, wherein said holding means includes a sealing interconnection between said central wafer and each of said outer wafers respectively, said interconnections circumscribing the circumference of said opening.

7. In apparatus as set forth in claim 5, wherein said holding means includes a plurality of relatively stiff, elongated members traversing the edges of the respective wafers and being secured to said edges.

8. In apparatus as set forth in claim 7, wherein said members are electrically conductive, and certain of same are in electrically coupled relationship with said electrically conductive means.

References Cited in the file of this patent

UNITED STATES PATENTS 2,437,128 Bock ---------- Mar. 2, 1948

2,457,563 Keller ---------- Dec. 28, 1948
2,771,663 Henry ---------- Nov. 27, 1956
2,866,136 Coda ---------- Dec. 23, 1958

FOREIGN PATENTS 877,133 France ---------- Sept. 1, 1942
953,895 France ---------- May 30, 1949

OTHER REFERENCES

Mount: "West Coast Conference," June 25, 1958, Electronic Design.